United States Patent [19]

Woodard

[11] 3,875,415

[45] Apr. 1, 1975

[54] METHOD AND APPARATUS FOR DETECTING A REGISTRATION MARK ON A TARGET SUCH AS A SEMICONDUCTOR WAFER

[75] Inventor: Ollie C. Woodard, Poughkeepsie, N.Y.

[73] Assignee: International Business Machines Corporation, Armonk, N.Y.

[22] Filed: Jan. 28, 1974

[21] Appl. No.: 437,434

[52] U.S. Cl. ....................... 250/492, 219/121 EB

[51] Int. Cl. ............................................ H01j 37/00

[58] Field of Search........... 250/492 A; 219/121 EB; 29/584

[56] References Cited

UNITED STATES PATENTS

| | | | |
|---|---|---|---|
| 3,644,700 | 2/1972 | Kruppa | 250/492 A |
| 3,651,303 | 3/1972 | Rehme | 250/492 A |
| 3,745,358 | 7/1973 | Firtz | 250/492 A |
| 3,832,561 | 8/1974 | O'Keefe | 250/492 A |

*Primary Examiner*—Eli Lieberman
*Assistant Examiner*—C. E. Church
*Attorney, Agent, or Firm*—Frank C. Leach, Jr.; Theodore E. Galanthay

[57] ABSTRACT

A square-shaped beam of charged particles is passed over a registration mark, which is formed by a depression in the surface of a semiconductor wafer. When the beam passes over one edge of the mark, a positive peak signal is produced while a negative peak signal is produced when the beam passes over the other edge of the mark. These positive and negative signals are compared with positive and negative threshold signals in comparators with an output signal being produced from each of the comparators when its threshold signal is crossed. This enables location of each of the edges of the mark to be determined. The positive and negative threshold signals are set for each of the areas of the wafer having one of the marks since different signal baseline voltages are produced by different areas of the wafer.

15 Claims, 10 Drawing Figures

METHOD AND APPARATUS FOR DETECTING A REGISTRATION MARK ON A TARGET SUCH AS A SEMICONDUCTOR WAFER

In U.S. Pat. No. 3,644,700 to Kruppa et al., there is shown a method and apparatus for controlling a square-shaped electron beam. The beam is employed to both write desired patterns on chips of a semiconductor wafer and to locate each chip relative to a predetermined position through determining the positions of a pair of registration marks for each chip by utilization of the beam.

In the aforesaid Kruppa et al. patent, a voltage, which is related to the background signal produced by the electrons of the beam being backscattered from the surface of the wafer against PIN diodes during a portion of a scan prior to the beam crossing the registration mark, is used as a signal level voltage. The positive and negative threshold voltages are then obtained by a predetermined fixed addition and subtraction, respectively, to this signal level voltage.

Because the surface of the wafer has varying conditions, there may be some instances in which the threshold voltages in the aforesaid Kruppa et al. patent may not be crossed by the peak signals produced by the beam passing across the edges of the mark. This is because the surface of the wafer may prevent sufficient deflection of the electrons to produce the necessary peak signal in comparison with the fixed addition and subtraction to the signal level voltage to produce the positive and negative threshold voltages, respectively.

When producing a semiconductor wafer having different levels, the materials of the various levels may differ substantially insofar as the amplitude of the signals produced by electrons from the beam being directed thereagainst. As a result, substantial changes in the amplitudes of the signals are produced by different materials at the different levels of the same semiconductor wafer. While the differential amplifier, which receives the signals from the PIN diodes in the aforesaid Kruppa et al. patent due to the beam passing over the edges of the registration mark, has a substantial range to handle various changes in the amplitudes of the signals, it is not always capable of handling the wide ranges in the amplitudes of the signals produced at the different levels of a semiconductor wafer.

The present invention is an improvement of the aforesaid Kruppa et al. patent insofar as locating each of the registration marks used with the various chips of a semiconductor wafer. The present invention is capable of adapting to any signal condition produced by the condition of the surface of the wafer, the material of the wafer at the particular level, the tilt of the wafer, rotational error due to location of the wafer, the error in putting down the registration marks, or any other factor affecting the signal condition.

The present invention utilizes a method and apparatus in which a signal baseline voltage is first placed within a predetermined range by an automatic bias circuit during a first scan by the beam over the area of the chip having one of the registration marks. The signal baseline voltage is produced by backscattering of the electrons from the surface of the wafer in the area of the chip having the registration mark. The amplitude of this voltage varies significantly in accordance with the surface of the wafer. In the present invention, it is desired that the signal baseline voltage always be within a predetermined range, and the automatic bias circuit insures that the signal baseline voltage in the area in which the registration mark is located is within this predetermined range.

In the method and apparatus of the present invention, the signal baseline voltage is determined during the second scan along with positive and negative peak signals produced by the beam passing over the edges of the mark. Positive and negative threshold voltages are then utilized through taking the same percentage of the positive and negative peak voltages in comparison with the signal baseline voltage. Thus, the threshold voltages are correlated to the peak signals to be expected from the registration mark in the specific area of the semiconductor wafer to be scanned by the beam.

With different levels of a semiconductor wafer formed of different materials, the backscatter of the electrons of the beam from each level can be significantly different. As a result, the amplitudes of the signals from the electron beam scanning the area can be significantly different for different levels of the same wafer. The present invention utilizes a gain control to maintain the amplitudes of the signals within a desired range.

An object of this invention is to provide a method and apparatus for locating a registration mark on a target such as a semiconductor wafer.

Another object of this invention is to provide a sensing arrangement for detecting the location of registration marks of a target such as a semiconductor wafer in which the sensing arrangement adapts to any signal condition.

The foregoing and other objects, features, and advantages of the invention will be more apparent from the following more particular description of a preferred embodiment of the invention as illustrated in the accompanying drawings.

Figure 1:
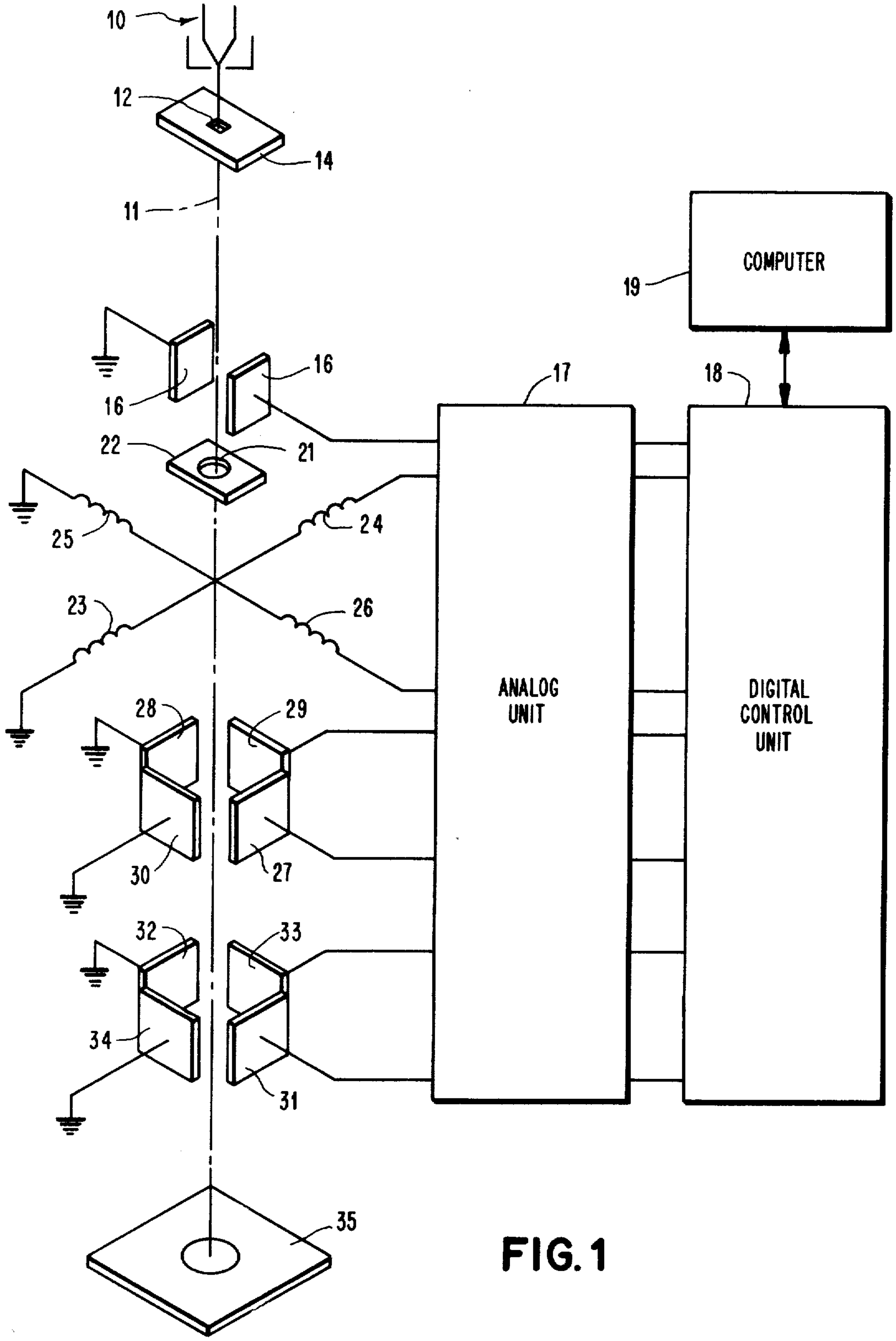
FIG. 1 is a schematic view showing an electron beam and the apparatus for controlling the beam.

Referring to the drawings and particularly FIG. 1, there is shown an electron gun 10 for producing a beam 11 of charged particles in the well-known manner. The electron beam 11 is passed through an aperture 12 in a plate 14 to shape the beam 11. The beam 11 is preferably square shaped and has a size equal to the minimum line width of the pattern that is to be formed.

The beam 11 passes between a pair of blanking plates 16, which determines when the beam is applied to the material and when the beam is blanked. The blanking plates 16 are controlled by circuits of an analog unit 17. The analog unit 17 is controlled by a digital control unit 18 in the manner more particularly shown and described in the copending patent application of Philip M. Ryan for "Method And Apparatus For Controlling Movable Means Such As An Electron Beam," Ser. No. 398,734, filed Sept. 19, 1973, and assigned to the same assignee as the assignee of this application. The digital control unit 18 is connected to a computer 19, which is preferably an IBM 370 computer.

The beam 11 then passes through a circular aperture 21 in a plate 22. This controls the beam 11 so that only the charged particles passing through the centers of the lenses (not shown) are used so that a square-shaped spot without any distortion is produced.

The beam 11 is next directed through magnetic deflection coils 23, 24, 25, and 26. The magnetic deflection coils 23 and 24 control the deflection of the beam 11 in a horizontal or X direction while the magnetic deflection coils 25 and 26 control the deflection of the beam 11 in a vertical or Y direction. Accordingly, the coils 23–26 cooperate to move the beam 11 in a horizontal scan by appropriately deflecting the beam. While the beam 11 could be moved in a substantially raster fashion as shown and described in the aforesaid Kruppa et al. patent, it is preferably moved in a back and forth scan so that the beam 11 moves in opposite directions along adjacent lines as shown and described in the aforesaid Ryan application. Thus, a negative bucking sawtooth is supplied to the coils 23 and 24 during forward scan of the type shown in FIG. 3*b* of the aforesaid Kruppa et al. patent while a positive bucking sawtooth, which is of opposite polarity to the sawtooth shown in FIG. 3*b* of the aforesaid Kruppa et al. patent, is supplied to the coils 23 and 24 during the backward scan.

The beam 11 then passes between a first set of electrostatic deflection plates 27, 28, 29, and 30. The electrostatic deflection plates 27 and 28 cooperate to deflect the beam in a horizontal or X direction while the electrostatic deflection plates 29 and 30 cooperate to move the beam 11 in a vertical or Y direction. The plates 27–30 are employed to provide any desired offset of the beam 11 at each of the predetermined positions or spots to which it is moved. In the aforesaid Kruppa et al. patent, the plates 27–30 corrected for linearity, but these correction signals are supplied to the coils 23–26 in this application.

After passing between the electrostatic deflection plates 27–30, the beam 11 then passes between a second set of electrostatic deflection plates 31, 32, 33, and 34. The electrostatic deflection plates 31 and 32 cooperate to deflect the beam 11 in the horizontal or X direction while the electrostatic deflection plates 33 and 34 cooperate to move the beam 11 in the vertical or Y direction. The plates 31–34 are employed to shift the beam 11, as more particularly shown and described in the copending patent application of Michel S. Michail et al. for "Method And Apparatus For Positioning A Beam Of Charged Particles," Ser. No. 437,585, filed Jan. 28, 1974, and assigned to the same assignee as the assignee of this application, at each of the predetermined positions to which the beam 11 is moved to move the beam 11 from the predetermined position to the actual deviated position at which the beam 11 must be applied to fit the pattern within the actual field.

The beam 11 is then applied to a target, which is supported on a table 35. The table 35 is movable in the X and Y directions as more particularly shown and described in the aforesaid Kruppa et al. patent.

The beam 11 is moved through A, B, and C cycles as shown and described in the aforesaid Kruppa et al. patent. The present invention is concerned with processing the signals during the A cycle of the beam 11 to detect the location of each of the registration marks.

Figure 8:
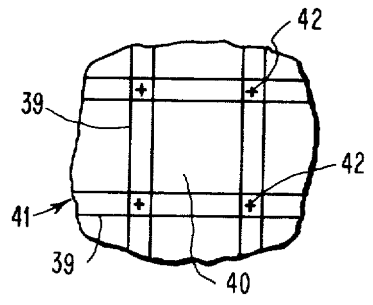
FIG. 8 is a top plan view of a portion of a semiconductor wafer having chips to which the beam is to be applied and showing the relation of the overlapped fields within which the chips are located.

As shown in FIG. 8, the target may comprise a plurality of fields 39 which overlap each other. A chip 40 is formed within each of the fields 30 so that there is a plurality of the chips 40 on a semiconductor wafer 41 with each of the chips 40 having resist to be exposed by the beam 11.

There is a registration mark 42 (schematically shown as a cross in FIG. 8) at each of the four corners of each of the fields 39. As shown in FIG. 8, the overlapping of the adjacent fields 39 results in the same registration mark 42 being utilized for each of four different fields 39. Thus, the registration mark 42 in the lower right corner of the only complete field 39 shown in FIG. 8 also is the registration mark in the lower left corner for the field 39 to the right of the complete field 39, the upper right corner of the field below the complete field 39, and the upper left corner of the field 39 which is diagonally to the right of the completed field 39.

Figure 9:
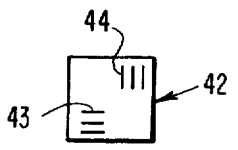
FIG. 9 is an enlarged top plan view of a registration mark that is to be detected.

Each of the registration marks 42 is preferably formed of a plurality of horizontally extending bars 43, preferably three in number as shown in FIG. 9, and a plurality of vertically extending bars 44, preferably equal in number to the number of the bars 43. Any other suitable arrangement of registration marks can be employed in which there can be scans of vertical edges of the mark in the X direction and horizontal edges of the mark in the Y direction.

As explained in the aforesaid Michail et al. application, each of the fields 39 uses the registration mark 42 at each of the four corners to locate the field 39 in which writing of the pattern is to occur. The overlapping of the fields 39 enables writing to occur between the adjacent fields. The boundary of each of the chips 40 is within the overlapping area of the field 39 of the chip 40.

The exact location of each of the registration marks 42 is obtained through passing the electron beam 11 over the vertical edges of the vertically disposed bars 44 of the mark 42 during scans in the X direction and over the horizontal edges of the horizontally disposed bars 43 of the mark 42 during scans in the Y direction. A registration detector is employed to detect when the electron beam 11 passes over each of the edges of the registration mark 42.

Figure 2:
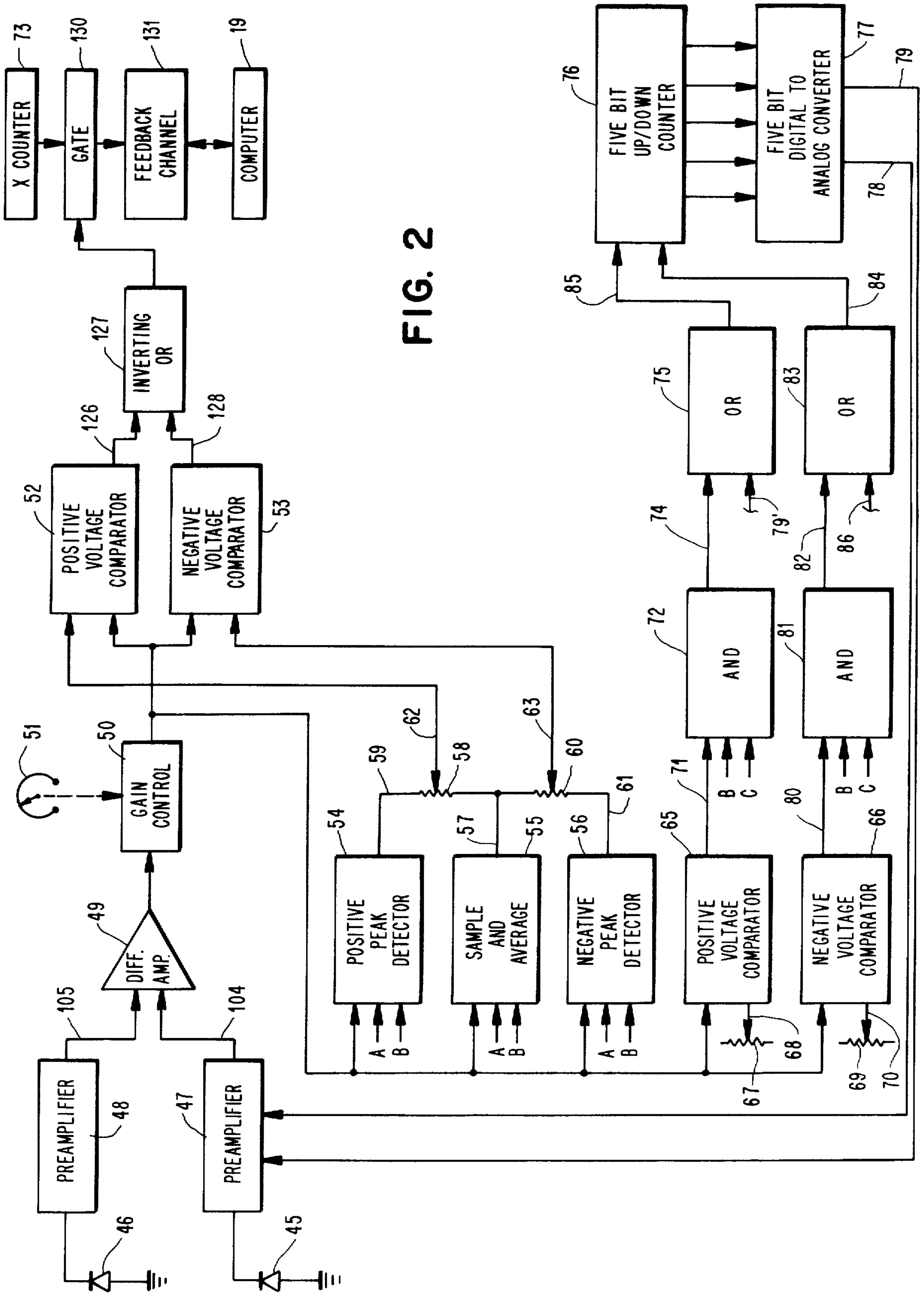
FIG. 2 is a schematic block diagram of a circuit arrangement for processing the signals for detecting a registration mark.

The registration detector preferably includes four PIN diodes (two shown at 45 and 46 in FIG. 2) disposed above the semiconductor wafer 41 and have an opening formed therebetween through which the beam 11 passes to impinge upon the semiconductor wafer 42. While the two PIN diodes 45 and 46 shown in FIG. 2 are for the X scans, it should be understood that two of the PIN diodes (not shown) are utilized with a similar circuit to that of FIG. 2 for the Y scans. The four diodes (two shown at 45 and 46) can be arranged in a quadrant arrangement as shown in the aforesaid Kruppa et al. patent, or a rectangular arrangement, or with a plane of the diodes (two shown at 45 and 46) parallel to the travel of the beam 11, for example.

As the electron beam 11 passes over the vertical bars 44 of the registration mark 42 during an X scan, the backscatter of the electrons from the semiconductor wafer 41 changes when the beam 11 passes over one of the vertical edges of one of the bars 44 of the registration mark 42. Each of the bars 43 and 44 of the registration mark 42 is preferably formed by a depression in the surface of the wafer 41. Thus, when the beam 11 enters the depression, one of the diodes 45 and 46 produces a greater signal than the other of the diodes 45 and 46, and the reverse arrangement happens when the beam 11 moves out of the depression.

The diode 45 is connected to a preamplifier 47, and the diode 46 is connected to a preamplifier 48. The preamplifiers 47 and 48 are connected to a differential amplifier 49, which amplifies the signal difference between the preamplifiers 47 and 48. Thus, during an X scan by the beam 11 over the vertical edges of each of the vertically disposed bars 44 of the registration mark 42, there is a positive peak signal and a negative peak signal produced at the output of the differential amplifier 49 for each of the bars 44 with one occurring when the beam 11 enters the depression and the other occurring when the beam 11 leaves the depression.

The output of the differential amplifier 49 is fed to a gain control 50 to control the amplitude of the output. The gain control 50 is adjusted through a manual switch 51 to change the gain of the gain control 50 in accordance with the material of the wafer 41. Thus, the material of the wafer 41 differs at different levels so that the gain of the gain control 50 is adjusted for the different levels of the wafer 41 through using empirical measurements and prior experiences to select the gain for the material at each level.

The output of the gain control 50 is supplied to a positive voltage comparator 52, which has a positive threshold voltage as a reference signal, and a negative voltage comparator 53, which has a negative threshold voltage as a reference signal. The output of the gain control 50 also is supplied to a positive peak detector 54, a sample and average circuit 55, and a negative peak detector 56.

The output of the sample and average circuit 55 provides a signal baseline voltage on its output line 57. The output line 57 of the sample and average circuit 55 is connected to one end of a resistor 58, which has its other end connected to output line 59 of the positive peak detector 54. The output line 57 of the sample and average circuit 55 also is connected to one end of a resistor 60, which has its other end connected to output line 61 of the negative peak detector 56.

A potentiometer 62, which has its wiper arm cooperating with the resistor 58, is connected as an input to the positive voltage comparator 52 to supply a percentage of the positive peak signal, which is captured by the positive peak detector 54, as the positive threshold signal to the positive voltage comparator 52. A potentiometer 63 has its wiper arm cooperating with the resistor 60 to supply a percentage of the negative peak signal from the negative peak detector 56 to the negative voltage comparator 53 as the negative threshold signal.

The setting of the wiper arms of the potentiometers 62 and 63 determines the per cent of the threshold voltage, both positive and negative, that exceeds the signal baseline voltage on the output line 57 of the sample and average circuit 55. It has been found that a setting of the arms of the potentiometers 62 and 63 at fifty per cent of the positive and negative peak voltages, respectively, produces a satisfactory threshold voltage irrespective of the signal baseline voltage on the output line 57 of the sample and average circuit 55.

The desired range for the setting of the arms of the potentiometers 62 and 63 is between fifty per cent and 75 per cent of the positive peak voltage on the output line 59 of the positive peak detector 54 and of the negative peak voltage on the output line 61 of the negative peak detector 56. The potentiometers 62 and 63 are set at the same per cent.

The output of the gain control 50 also is supplied to a positive voltage comparator 65 and a negative voltage comparator 66 of an automatic bias circuit. The voltage comparator 65 receives a reference voltage of 0.5 volt from a resistor 67, which has a reference signal applied thereto, through a potentiometer 68. The negative voltage comparator 66 receives a reference voltage of −0.5 volt from a resistor 69, which has a reference signal applied thereto, through a potentiometer 70.

The positive voltage comparator 65 has its output line 71 connected to an AND gate 72. The AND gate 72 also has an input from a bias gate, which is identified as input B, and an input, which is identified as input C, from a clock of an X counter 73, which is part of the digital control unit 18.

Whenever the threshold voltage, which is 0.5 volt, of the positive voltage comparator 65, is exceeded by the output voltage of the gain control 50, a positive signal is supplied on the output line 71 of the positive voltage comparator 65 as an input to the AND gate 72. During the first scan in the X direction, the bias gate for the X scan is positive or up so that this is a second satisfied condition for the AND gate 72. The third condition, which must be satisfied in addition to positive signals on the output line 71 and the input B for the AND gate 72 to supply a pulse on its output line 74, is an input (input C) from a clock of the X counter 73. Thus, each pulse from the clock of the X counter 73 produces a pulse on the output line 74.

Since each pulse on the output line 74 is due to the voltage at the output of the gain control 50 exceeding the maximum desired for the baseline signal voltage, the bias current supplied to the preamplifier 47 must be reduced. Accordingly, the output line 74 is connected through an OR gate 75 to a five bit up/down counter 76.

The counter 76 is reset to a count of sixteen just prior to start of the first X scan by the beam 11 after a reset pulse is supplied to the counter 76. This is just prior to the bias gate becoming positive.

The counter 76 is connected to a five bit digital to analog converter 77. As the counter 76 is counted down from sixteen by each pulse from the OR gate 75, the digital to analog converter 77 produces a decrease in a bias current on its output line 78 that changes the output voltage of the gain control by approximately one-fourth volt for each count. As a result, each count down of the counter 76 decreases the bias current to the preamplifier 47. This reduces the output of the preamplifier 47 so as to decrease the output voltage of the gain control 50 by approximately one-fourth volt.

The five bit digital to analog converter 77 has a second output line 79 also connected to the preamplifier 47. This supplies a reference current for the bias current on the output line 78 to the preamplifier 47.

The OR gate 75 is employed to enable the five bit up/down counter 76 and the five bit digital to analog converter 77 to be utilizied in both the X and Y scans. Thus, the OR gate 75 has an output line 79' of an AND gate (not shown), which has the same inputs as the AND gate 72, for the Y scan connected thereto. It should be understood that the AND gate for the Y scan has a bias gate, which is separate from the bias gate for the X scan, as the input B. There also is a separate positive voltage comparator for the Y circuit.

If the output of the gain control 50 is negative and greater than −0.5 volt, then the threshold voltage of the negative voltage comparator 66 is exceeded so that a positive pulse appears on output line 80 of the negative voltage comparator 66. The output line 80 is connected to an AND gate 81, which also has the inputs B and C. These inputs B and C to the AND gate 81 are the same as for the AND gate 72.

Thus, when the AND gate 81 is satisfied by the three conditions of a positive pulse on the output line 80 due to the output of the gain control 50 exceeding the threshold voltage of the negative voltage comparator 66, the bias gate (input B) being up, and a pulse (input C) from a clock of the X counter 73, a positive pulse appears on output line 82 of the AND gate 81. The pulse passes through an OR gate 83 to the five bit up/-down counter 76 to cause the five bit up/down counter 76 to count up from 16.

As shown in FIG. 2, the OR gate 83 is connected through its output line 84 to a different input of the five bit up/down counter 76 than is output line 85 of the OR gate 75. Thus, the direction in which the counter 76 counts from sixteen depends upon which of the lines 84 and 85 is supplying a positive signal thereto. It should be understood that the clock of the X counter 73 is selected so that its frequency of pulses (input C) enables the counter 76 to complete each count before another input is received.

The counter 76 will count up or down until the voltage at the output of the gain control 50 is again within the range of 0.5 volt to −0.5 volt so that neither of the voltage comparators 65 and 66 has its threshold voltage crossed. Whenever this occurs, the five bit up/down counter 76 ceases to count because it does not receive a pulse on either the output line 84 of the OR gate 83 or the output line 85 of the OR gate 75 since neither the AND gate 81 nor the AND gate 72 is satisfied.

The OR gate 83 functions in the same manner as the OR gate 75 in that it receives a second input from an output line 86 of an AND gate (not shown), which has the same inputs as the AND gate 81, connected to a negative voltage comparator in the Y circuit. It should be understood that the same changes are applicable for the Y circuit as discussed for the X circuit.

Figure 4:
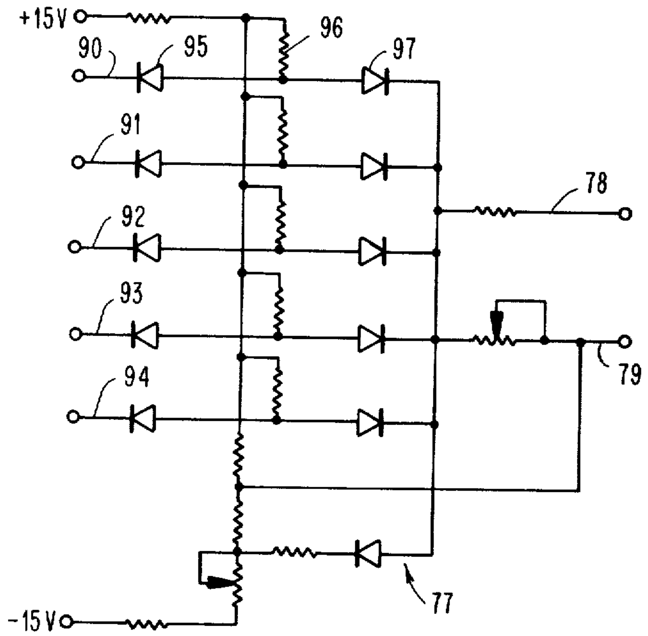
FIG. 4 is a schematic wiring diagram showing the five bit digital to analog converter of the circuit of FIG. 2.

As shown in FIG. 4, the five bit digital to analog converter 77 has a one bit input line 90, a two bit input line 91, a four bit input line 92, an eight bit input line 93, and a sixteen bit input line 94 connected to the output lines of the counter 76. As shown for the input 90 with each of the other input lines 91–94 having the same arrangement, the input line 90 has a diode 95 between its connections to the counter 76 and to a resistor 96, which is connected to both positive and negative voltages. A second diode 97 is disposed on the opposite side of the connection of the resistor 96 to the input line 90. The cathode of the diode 97 is connected to the output lines 78 and 79.

Thus, with the magnitude of the resistor 96 varying for each of the input lines 90–94, the input lines 90–94 enable changing of bias current to alter the voltage at the output of the gain control 50 in steps of approximately one-fourth volt in accordance with which of the input lines are receiving signals from the counter 76 as it counts up or down.

Figure 3:
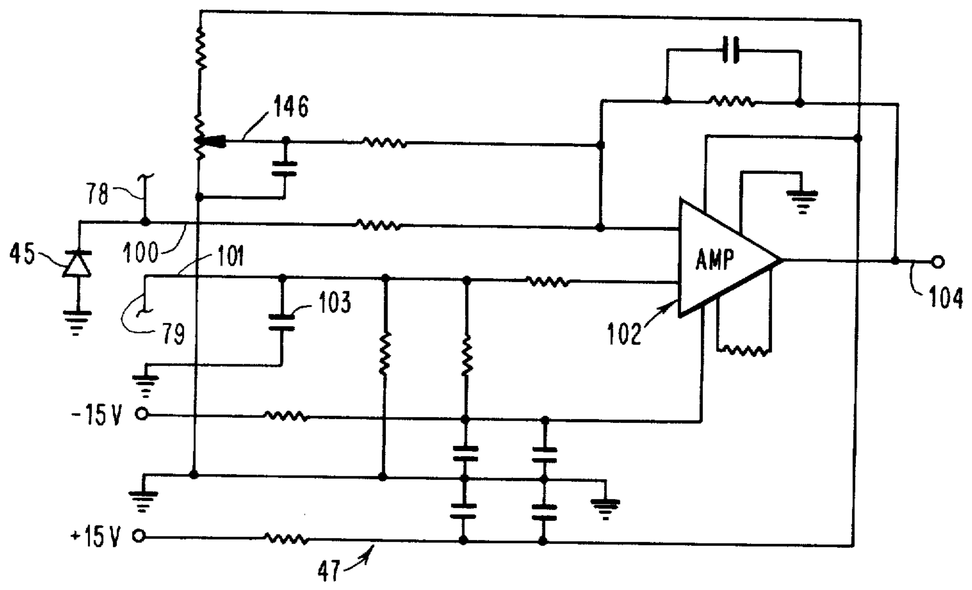
FIG. 3 is a schematic wiring diagram of a preamplifier of the circuit of FIG. 2.

As shown in FIG. 3, the output line 78 from the five bit digital to analog converter 77 is connected to an input line 100 of the preamplifier 47. The output line 79 of the five bit digital to analog converter 77 is connected to an input line 101 of the preamplifier 47.

The input line 100 also is connected to the cathode of the diode 45, which has its anode grounded. Thus, the preamplifier 47 supplies a current to the diode 45 while providing a low impedance thereto.

The input line 100 is connected to an operational amplifier 102, which is preferably a model 147C sold by Analog Device Company. The input line 101, which is connected to ground through a capacitor 103, also is connected to the operational amplifier 102.

Accordingly, changes in the bias current on the line 78 changes the signal on output line 104 of the preamplifier 47. Since this bias current remains fixed after counting up or down is completed during the first X scan, a fixed bias current is supplied from the five bit digital to analog converter 77 throughout the remainder of any X scans until one of the AND gates 72 and 81 is again activated during another of the first X scans.

The preamplifier 48 is the same as the preamplifier 47 except that the input line 100 is not connected to the output line 78 of the five bit digital to analog converter 77, and the input line 101 is not connected to the output line 79 of the five bit digital to analog converter 77. Thus, no signal from the five bit digital to analog converter 77 is supplied to the preamplifier 48.

A similar arrangement exists for the Y circuit in that the five bit digital to analog converter 77 has the output lines 78 and 79 connected to one of the preamplifiers in the Y circuit. The other preamplifier in the Y circuit is connected as is the preamplifier 48.

Figure 5A:
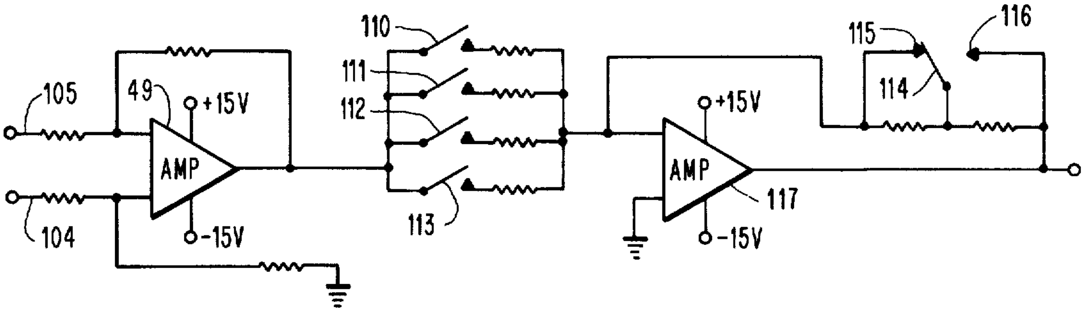
FIGS. 5A and 5B are a schematic wiring diagram of the differential amplifier and gain control of the circuit of FIG. 2.

As shown in FIG. 5A, the output line 104 of the preamplifier 47 and output line 105 of the preamplifier 48 supply input signals to the differential amplifier 49, which is a Mu741 operational amplifier. The output voltage of the differential amplifier 49 is supplied through the gain control 50, which includes relay switches 110, 111, 112, 113, and 114.

When the relay switch 110 is closed with the switch 114 in the position shown in FIG. 5A, the gain control 50 is set at a gain of one. With the switch 114 in the position shown in FIG. 5A, the closing of only the switch 111 provides a gain of two, the closing of only the switch 112 provides a gain of four, and the closing of only the switch 113 provides a gain of eight. The changing of the position of the switch 114 from engagement with a contact 115 to engagement with a contact 116 increases the gain by a scale of ten.

Figure 5B:
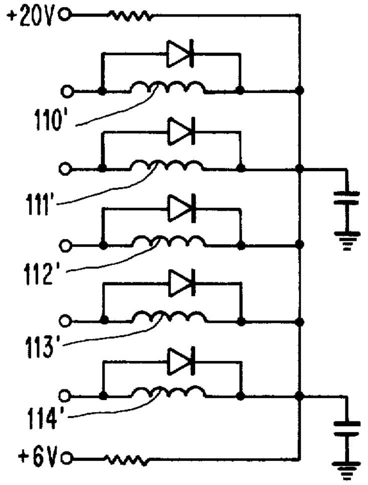

The coils of the relays for the switches 110, 111, 112, 113, and 114, respectively, are 110', 111', 112', 113', and 114' (see FIG. 5B). The position of the switch 51 determines which of the coils 110'–114' is energized to produce the desired gain by the gain control 50. When one or more of the coils 110'–114' is to be energized, the switch 51 connects the coil or coils to ground.

The gain control 50 includes an operational amplifier 117, which is the same as the operational amplifier forming the differential amplifier 49. The output of the amplifier 117 is the output of the gain control 50.

Figure 7:
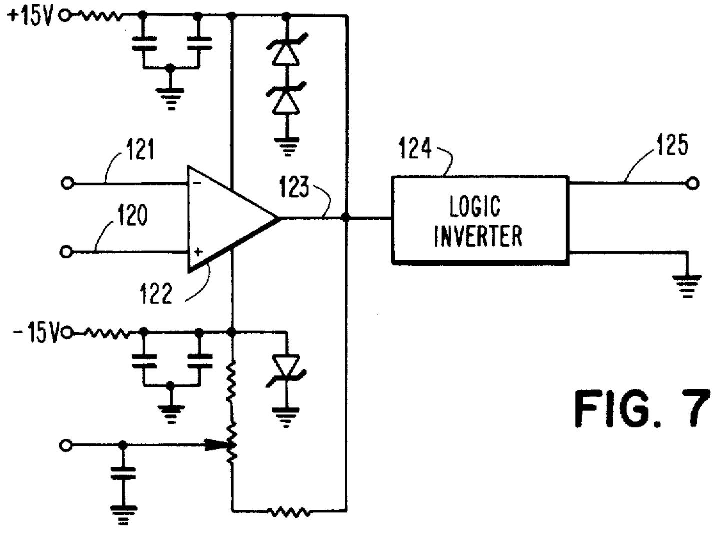
FIG. 7 is a schematic wiring diagram of any of the voltage comparators used in the circuit of FIG. 2.

Referring to FIG. 7, there is shown a circuit for any of the voltage comparators 52, 53, 65, and 66. The voltage comparator includes a positive input line 120 and a negative input line 121 to a voltage comparator 122. One suitable example of the voltage comparator 122 is sold as Model No. MC 1710G by Motorola.

To enable each of the positive voltage comparator 52 and the negative voltage comparator 53 to have the same output polarity, which is negative, when its threshold voltage is crossed, the positive voltage comparator 52 has the negative input line 121 connected to the potentiometer 62 (see FIG. 2) and the positive input line 120 connected to the output of the gain control 50. The negative voltage comparator 53 has the output of the gain control 50 connected to the negative input line 121 while the positive input line 120 is connected to the potentiometer 63.

In a similar manner, the positive voltage comparator 65 has the negative input line 121 connected to the output of the gain control 50 and the positive input line 120 connected to the potentiometer 68. The negative voltage comparator 66 has the positive input line 120 connected to the output of the gain control 50 while the negative input line 121 is connected to the potentiometer 70. This enables each of the comparators 65 and 66 to produce a positive output on the output lines 71 and 80, respectively, when its threshold voltage is crossed.

When the threshold voltage is crossed, the voltage comparator 122 produces a pulse on its output line 123, which is connected as an input to a logic inverter 124. The logic inverter 124 has an output line 125 from which the inverse of the pulse from that on the output line 123 is supplied.

The positive voltage comparator 52 has its output line 126 (see FIG. 2), which is the output line 125 of FIG. 7, connected to an inverting OR gate 127, which also is connected to output line 128 (This is the output line 125 of FIG. 7.) of the negative voltage comparator 53. The inverting OR gate 127 supplies a positive pulse to a gate 130, which is part of the digital control unit 18. This opens the gate 130 to allow the X counter 73 to supply pulses to a feedback channel 131 of the control unit 18.

Accordingly, since the comparator 52 or 53 supplies a positive pulse from the inverting OR gate 127 whenever one of the vertical edges of one of the vertically disposed bars 44 of the registration mark 42 is passed by the beam 11 during the X scan, the opening of the gate 130 results in the X counter 73 supplying a count to the feedback channel 131 of the digital control unit 18 so that the location of the scanned edge can be ascertained by the computer 19. Thus, both edges of each of the vertical bars 44 of the registration mark 42 are supplied to the logic of the feedback channel 131 so that the proper location of the mark 42 is readily determined.

Figure 6:
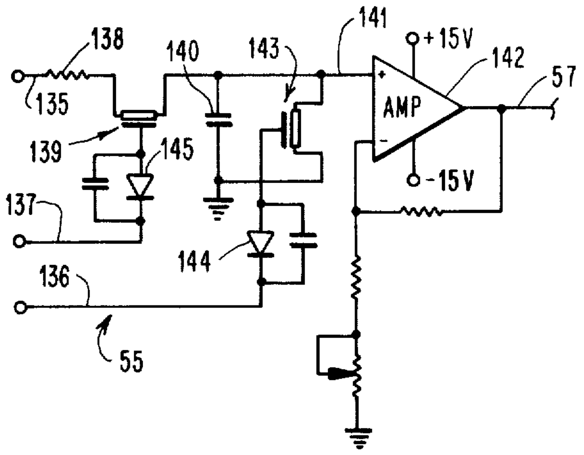
FIG. 6 is a schematic wiring diagram of the sample and average circuit of FIG. 2.

As shown in FIG. 6, the sample and average circuit 55 includes an input line 135 connected to the output of the gain control 50. An input line 136 has the bias gate signal, which is indicated by input B in FIG. 2 as previously mentioned for the AND gates 72 and 81, connected thereto while an input line 137 is connected to receive an average gate signal, which is indicated by input A in FIG. 2, as its input. The same inputs A and B also are supplied to the detectors 54 and 56.

The input line 135 is connected through a resistor 138 and an FET 139, which functions as a switch, to a capacitor 140. The charge on the capacitor 140 is supplied through a line 141 to the positive side of an operational amplifier 142 having the output line 57 of the sample and average circuit 55 as its output line. One suitable example of the operational amplifier 142 is sold by Philbrick Nexus as Model No. 1408-02.

The sample and average circuit 55 includes a second FET 143, which also functions as a switch. The second FET 143 is connected through a diode 144 to the input line 136 while the first FET 139 is connected through a diode 145 to the input line 137.

When the bias gate for the X scan is up during the first X scan, the cathode of the diode 144 has a positive voltage thereon so that the capacitor 140 discharges to ground through the FET 143 since the FET 143 conducts at this time between its source and drain so as to become a closed switch. Thus, the charge on the capacitor 140 from the previous scan cycle in the X direction is removed during the first scan of the new scan cycle in the X direction.

During the second scan of the new cycle, the average gate signal, which is connected to the input line 137, for the X scan goes up so that the first FET 139 conducts between its source and drain as the cathode of the diode 145 is now positive. As a result, the output of the gain control 50 is supplied through the resistor 138 and the conducting FET 139, which is a closed switch, to charge the capacitor 140. The time constant of the resistor 138 and the capacitor 140 is selected so that the sample and average circuit 55 effectively averages the voltages appearing at the gain control 50 during the second X scan through integrating the signal on the input line 135. The charge on the capacitor 140 represents this average voltage.

At the completion of the second scan, the average gate goes down so that the FET 139 ceases to conduct to disconnect the capacitor 140 from the input line 135. However, the capacitor 140 continues to supply the signal thereon through the line 141 to the operational amplifier 142 throughout the remainder of the scan cycle, which comprises eighteen additional scans, in the X direction.

Considering the operation of tne present invention, the gain control 50 is set by the switch 51 so that the gain of the gain control 50 produces output signals having a peak voltage of one to two volts. The DC output level of each of the preamplifiers 47 and 48 should be set at zero by a slight adjustment of a potentiometer 146 (see FIG. 3) of each of the preamplifiers 47 and 48. This should be done with the beam 11 on and over the semiconductor wafer 41 at the start. During the first X scan, the capacitor 140 of the sample and average circuit 55 is discharged through the FET 143 becoming conductive by the bias gate for the X scan going up. The bias gate for the X scan also is supplied to the peak detectors 54 and 56 to cause them to also have the peak voltages removed at this time. Each of the peak detectors 54 and 56 is preferably a capacitor having a first electronic switch such as an FET, for example, that allows discharge of the capacitor during the first scan and a second electronic switch such as an FET, for example, that allows charging of the capacitor during the second scan to obtain the peak signal during the second scan.

Accordingly, as the electron beam 11 is moved over the registration mark 42 on the semiconductor wafer 41 during the first scan, the positive voltage comparator 65 and the negative voltage comparator 66 receive the output voltage of the gain control 50 to determine if the signal baseline voltage, which is that produced by the backscattering of the electrons of the beam 11, is within the desired range of 0.5 volt to −0.5 volt. If the signal baseline voltage, which is the output of the gain control 50, is not within the range, then one of the comparators 65 and 66 will have its threshold voltage crossed and the connected AND gate 72 or 81 will supply pulses in coordination with the pulses from the clock of the X counter 73 to the five bit up/down counter 76 due to the bias gate for the X scan being up. If the voltage is too high, then the positive voltage comparator 65 has its threshold voltage exceeded so that a positive signal appears on the output line 85 of the OR gate 75 to cause the five bit up/down counter 76 to count down from sixteen. This causes the five bit digital to analog converter 77 to reduce the bias current on the output line 78 for each count of the counter 76 until the output of the gain control 50 is again in the desired voltage range so that there is no signal on the output line 71 of the positive voltage comparator 65.

If the output of the gain control 50 is negative and outside of the range, then the voltage comparator 66 has its threshold voltage exceeded so that there is a positive signal on the output line 80 of the negative voltage comparator 66. This results in each of the pulses of the clock of the X counter 73 being supplied through the output line 84 of the OR gate 83 to the five bit up/down counter 76 to cause up counting thereof. This causes the five bit digital to analog converter 77 to supply an increasing bias current on the output line 78 to the preamplifier 47 until the output of the gain control 50 is decreased to fall within the desired range.

At the completion of the first X scan, the bias gate for the X scan goes down. Thus, there can be no activation of the AND gates 72 and 81 during the remainder of the X scans for the registration mark 42, which is being scanned in the X direction.

During the first and second scans, the gate 130 is prevented from being enabled by any signals from the inverting OR gate 127. This prevents any signals from being fed to the feedback channel 131 of the digital control unit 18 from the X counter 73.

During the second scan in the X direction, the average gate for the X scan goes up so that the positive peak detector 54 measures the positive peak signal received from the differential amplifier 49 through the gain control 50. This is when the beam 11 passes over one of the edges of one of the vertical bars 44 of the registration mark 42.

Because the average gate is up during the second X scan, the positive peak detector 54 can receive the output of the gain control 50 since an electronic switch is closed to allow charging of the capacitor of the positive peak detector 54. Since the average gate for the X scan is up only during the second X scan, the positive peak detector 54 will receive no further signals during the remainder of the scans of the registration mark 42 because the electronic switch opens.

Similarly, the negative peak detector 56 receives the negative peak signal from the differential amplifier 49 through the gain control 50 only during the second scan. This is when the beam 11 is passing over the other of the edges of the depression, which forms one of the vertical bars 44 of the registration mark 42 being scanned. The negative peak detector 56 also is inactivated during the remaining scans of the registration mark 42 since the average gate for the X scan is no longer up.

The sample and average circuit 55 has the capacitor 140 (see FIG. 6) charged during the second X scan since the first FET 139 is conducting because of the average gate for the X scan being up. At the completion of the second X scan, the average gate goes so that the first FET 139 ceases to conduct. Thus, there is no further signal to the sample and average circuit 55 during the remainder of the scans in the X direction of the registration mark 42 during the particular X scan cycle.

With each of the positive peak detector 54, the sample and average circuit 55, and the negative peak detector 56 having the required signals therein at the completion of the second X scan, the positive voltage comparator 52 and the negative voltage comparator 53 have their threshold voltages set in accordance with the material forming the level of the wafer 41 and the condition of the surface of the wafer 41 having the registration mark 42. Thus, the threshold voltages in the positive voltage comparator 52 and the negative voltage comparator 53 will be set so that they will be crossed during each scan in the X direction by the beam 11. Accordingly, two separate positive signals (The input connections to the comparators 52 and 53 produce the same negative output.) for each of the vertical bars 44 is supplied from the inverting OR gate 127 during each scan after the first two scans to the gate 130.

The eighteen scans of the registration mark 42 in the X direction after the first two scans are employed to insure averaging of the location of the registration mark 42. This reduces the per cent of error to a satisfactory minimum.

Since the registration mark 42 preferably includes the three vertical bars 44 and the three horizontal bars 43 as shown in FIG. 9, there would be six negative signals (three from the positive voltage comparator 52 and three from the negative voltage comparator 53) to the inverting OR gate 127 during each scan in the X direction. Similarly, when the Y circuit for the Y scan is utilized, there also would be six negative signals to the inverting OR gate 127 during each scan in the Y direction.

It should be understood that the Y circuits of FIG. 2 are employed during the scans in the Y direction. There also are the same number of scans (20) in each scan cycle with there being a bias gate, which is separate from the bias gate for the X scan, during the first scan in the Y direction and an average gate, which is separate from the average gate in the X scan, during the second scan in the Y direction.

With the information in the feedback channel 131 as to the location of the registration mark 42 with respect to its desired location, the location of the field 39 can be determined by the four registration marks 42 at the four corners of the field 39 as more particularly shown and described in the aforesaid Michail et al application.

It should be understood that the beam 11 requires the use of a focus grid and a calibration grid in the same manner as described in the aforesaid Kruppa et al patent. One suitable example of these grids is the focus and calibration grids of the aforesaid Kruppa et al patent.

While each of the registration marks 42 has been described as having the bars 43 and 44 formed as depressions, it should be understood that the bars 43 and 44 could be formed otherwise as long as they produced a signal when the beam 11 passed over each edge thereof. For example, each of the bars 43 and 44 could be a raised portion.

An advantage of this invention is that it is adaptable to any signal condition. Another advantage of this invention is that it removes the residual pedestal of the signal produced by backscatter at the diodes through the use of the automatic bias current to the preamplifiers. A further advantage of this invention is that it adjusts the gain for the particular material at the level of the wafer being scanned. Still another advantage of this invention is that the threshold voltage is always selected in accordance with the condition of the wafer in the area of the registration mark.

While the invention has been particularly shown and described with reference to a preferred embodiment thereof, it will be understood by those skilled in the art that various changes in form and details may be made therein without departing from the spirit and scope of the invention.

What is claimed is:

1. An apparatus for determining the location of a registration mark on a target including:

means to sense the beginning of the registration mark and the end of the registration mark when the registration mark is scanned by a beam of charged particles;

said sensing means including means to produce a first peak electrical signal at the beginning of the registration mark and a second peak electrical signal at the end of the registration mark with the two peak electrical signals being of opposite polarity;

first means to produce a first threshold signal correlated to the first peak electrical signal and to a signal baseline voltage determined by the surface of the target in the area having the registration mark;

second means to produce a second threshold signal correlated to the second peak electrical signal and to a signal baseline voltage determined by the surface of the target in the area having the registration mark;

third means to produce a first signal when the first peak electrical signal crosses the first threshold signal;

fourth means to produce a second signal when the second peak electrical signal crosses the second threshold signal;

and means to determine the positions of the beginning and end of the registration mark in accordance with the positions of the beam when the first and second signals are produced.

2. The apparatus according to claim 1 including means to maintain the signal baseline voltage within a predetermined range.

3. The apparatus according to claim 2 including means to control the amplitude of each of the peak electrical signals with a predetermined range.

4. The apparatus according to claim 3 in which the target is a semiconductor wafer.

5. The apparatus according to claim 1 including means to control the amplitude of each of the peak electrical signals within a predetermined range.

6. A method of locating a registration mark on a target defined by at least one pair of edges by moving a beam of charged particles over the area of the target having the registration mark in a plurality of line-by-line scans including:

making a first scan over the area of the target having the registration mark to cause a signal baseline voltage to be within a predetermined range in accordance with the material of the area having the registration mark;

making a second scan over the area of the target having the registration mark to ascertain the signal baseline voltage in accordance with the material of the area having the registration mark and to ascertain the highest positive and negative peak signals produced from the beam passing over the edges of the registration mark;

selecting a percentage of the positive peak signal in comparison with the signal baseline voltage obtained during the second scan to produce a positive threshold signal for all scans after the second scan;

selecting a percentage of the negative peak signal in comparison with the signal baseline voltage obtained during the second scan to produce a negative threshold signal for all scans after the second scan;

producing a first signal when one of the positive and negative threshold signals is crossed by a signal produced by the beam passing over one of the pair of edges of the registration mark during a third scan;

producing a second signal when the other of the positive and negative threshold signals is crossed by a signal produced by the beam passing over the other of the pair of edges of the registration mark during the third scan;

making a plurality of additional scans to produce additional first and second signals;

and utilizing the first and second signals in conjunction with the location of the beam during the scan in which each of the first and second signals is produced to locate the position of the registration mark on the target.

7. The method according to claim 6 including removing prior positive and negative threshold signals during the first scan.

8. The method according to claim 7 including maintaining the amplitude of the signals produced by the beam passing over the edges of the registration mark within a predetermined range during the scans.

9. The method according to claim 8 in which prior positive and negative threshold signals are removed during the first scan by removing the signal baseline voltage, the positive peak voltage, and the negative peak voltage obtained during the second scan of the prior scan cycle.

10. The method according to claim 9 in which the target is a semiconductor wafer.

11. The method according to claim 7 in which prior positive and negative threshold signals are removed during the first scan by removing the signal baseline voltage, the positive peak voltage, and the negative peak voltage obtained during the second scan of the prior scan cycle.

12. The method according to claim 11 in which the target is a semiconductor wafer.

13. The method according to claim 6 including maintaining the amplitude of the signals produced by the beam passing over the edges of the registration mark within a predetermined range during the scans.

14. The method according to claim 13 in which the target is a semiconductor wafer.

15. The apparatus according to claim 1 including means to supply a bias signal to said producing means of said sensing means to maintain the signal baseline voltage within a predetermined range.

* * * * *